United States Patent [19]

Kawabata et al.

[11] Patent Number: 5,453,340
[45] Date of Patent: Sep. 26, 1995

[54] PHOTOSENSITIVE COMPOSITION FOR VOLUME HOLOGRAM RECORDING

[75] Inventors: Masami Kawabata, Takatsuki; Akihiko Sato, Suita; Iwao Sumiyoshi, Osaka, all of Japan

[73] Assignee: Nippon Paint Company, Ltd., Osaka, Japan

[21] Appl. No.: 152,094

[22] Filed: Nov. 15, 1993

Related U.S. Application Data

[62] Division of Ser. No. 870,422, Apr. 17, 1992, abandoned.

[30] Foreign Application Priority Data

Apr. 17, 1991 [JP] Japan ................................ 3-085177
Mar. 25, 1992 [JP] Japan ................................ 4-067021

[51] Int. Cl.⁶ .................................................. G03H 1/02
[52] U.S. Cl. ........................... 430/2; 430/1; 430/290; 359/3; 522/4
[58] Field of Search ................. 430/1, 2, 290, 430/287, 286; 359/1, 3; 522/4

[56] References Cited

U.S. PATENT DOCUMENTS

| | | | |
|---|---|---|---|
| 3,923,507 | 12/1975 | Öhlschager et al. | 430/78 |
| 4,156,035 | 5/1979 | Tsao et al. | |
| 4,227,978 | 10/1980 | Barton. | |
| 4,250,053 | 2/1981 | Smith | 522/25 |
| 4,291,114 | 9/1981 | Berggren et al. | 430/281 |
| 4,426,431 | 1/1984 | Harasta et al. | 522/15 |
| 4,428,807 | 1/1984 | Lee et al. | 522/15 |
| 4,588,664 | 5/1986 | Fielding et al. | 430/1 |
| 4,717,605 | 1/1988 | Urban et al. | 522/25 |
| 4,849,320 | 7/1989 | Irving et al. | 522/4 |
| 4,913,990 | 4/1990 | Rallison | 430/1 |
| 4,950,567 | 8/1990 | Keys et al. | 430/1 |
| 4,959,283 | 9/1990 | Smothers et al. | 430/2 |
| 4,970,129 | 11/1990 | Ingwall et al. | 430/290 |
| 5,002,855 | 3/1991 | Fan et al. | 430/945 |
| 5,098,804 | 3/1992 | Booth | 430/290 |
| 5,102,924 | 4/1992 | Williams et al. | 522/174 |
| 5,213,915 | 5/1993 | Ichihashi et al. | 430/290 |

FOREIGN PATENT DOCUMENTS

| | | |
|---|---|---|
| 0188380 | 7/1986 | European Pat. Off. |
| 0324482 | 7/1989 | European Pat. Off. |
| 0344911 | 12/1989 | European Pat. Off. |
| 0360869 | 4/1990 | European Pat. Off. |
| 0425440 | 5/1991 | European Pat. Off. |
| 0487086 | 5/1992 | European Pat. Off. |
| 228261 | 1/1990 | Japan. |
| 280423 | 3/1990 | Japan. |

OTHER PUBLICATIONS

Abstract of JP 2–75617 Okawa et al (Mar. 1990).
Abstract of JP 2–80422 Okawa et al (Mar. 1990).

*Primary Examiner*—Charles L. Bowers, Jr.
*Assistant Examiner*—Martin J. Angebranndt
*Attorney, Agent, or Firm*—Wenderoth, Lind & Ponack

[57] ABSTRACT

Disclosed is a photosensitive composition for volume hologram recording which is used for recording an interference fringe produced by a laser beam or a light having excellent coherence, as fringes having different refractive index. The composition comprising:

(a) a cationic polymerizable compound which is liquid at ambient temperature;

(b) a radical polymerizable compound;

(c) a radical photopolymerization initiator composition sensitized by a laser beam or a light having excellent coherence which has a specific wavelength to polymerize the ingredient (b); and (d) a cationic photopolymerization initiator composition which shows low photosensitivity to the light having a specific wavelength and is sensitized by a light having the other wavelength to polymerize the ingredient (a), wherein an average refractive index of the ingredient (a) is smaller than that of the ingredient (b). A process for producing the photosensitive composition is also disclosed.

5 Claims, 1 Drawing Sheet

PHOTOSENSITIVE COMPOSITION FOR VOLUME HOLOGRAM RECORDING

This application is a divisional application of now abandoned application, Ser. No. 07/870,422, filed Apr. 17, 1992, now abandoned.

FILED OF THE INVENTION

The present invention relates to a photosensitive composition for volume hologram recording, and a process for producing a volume hologram using the same. More particularly, it relates to a photosensitive composition for volume hologram recording, which provides a hologram having excellent diffraction efficiency, wavelength selectivity, refractive index modulation, film strength, etc., and a process for producing a volume hologram wherein a hologram can be easily produced using the same.

BACKGROUND OF THE INVENTION

A hologram is that in which two lights having the same wavelength (object light and reference light) are allowed to interfere with each other to record the wave front of the objective light as an interference fringe on a photosensitive material. When the hologram is irradiated by a light having the same condition as that of the original reference light, a diffraction phenomenon due to the interference fringe occurs, and the same wave front as that of the original object light can be reproduced.

The hologram is classified into various kinds according to the recording form of the interference fringe. A so-called volume hologram in which the interference fringe is recorded according to the difference of refractive index in the inside of a recording layer has recently been used for applications such as three-dimensional display, optical element, etc. because of its high efficiency and excellent wavelength selectivity.

As the photosensitive material for recording the volume hologram, for example, silver halide or gelatin dichromate have hitherto been used in the field of art. However, since these materials require wet development or complicated fixing treatment, it is not suitable to produce the hologram industrially. Further, there is a disadvantage that the recorded image may disappear due to moisture.

In order to solve the above disadvantage, U.S. Pat. Nos. 3,658,526 and 3,993,485 suggest the preparation of a volume hologram using a photopolymer by a simple dry treatment. Further, a mechanism of forming a hologram using a photopolymer is estimated in Applied Optics, B.L. Booth, Vol. 14, No. 3, pages 593–601 (1975); Applied Optics, W. J. Tomlinson & E. A. Chandross, Vol. 15, No. 2, pages 534–541 (1976) and the like. However, these techniques were inferior to the above prior art in refractive index modulation which is one of the important properties. U.S. Pat. Nos. 4,942,102 and 4,942,112 suggest the improvement of it by using a non-reactive plasticizer. However, the hologram thus formed is inferior in film strength and the refractive index modulation is not sufficiently improved.

OBJECTS OF THE INVENTION

One object of the present invention is to provide a photosensitive composition for volume hologram recording, which provides a hologram having excellent diffraction efficiency, wavelength selectivity, refractive index modulation, film strength, etc.

Another object of the present invention is to provide a process for producing a volume hologram wherein a hologram can be easily produced using the same.

These objects as well as other objects and advantages of the present invention will become apparent to those skilled in the art from the following description with reference to the accompanying drawings.

SUMMARY OF THE INVENTION

Figure 1:
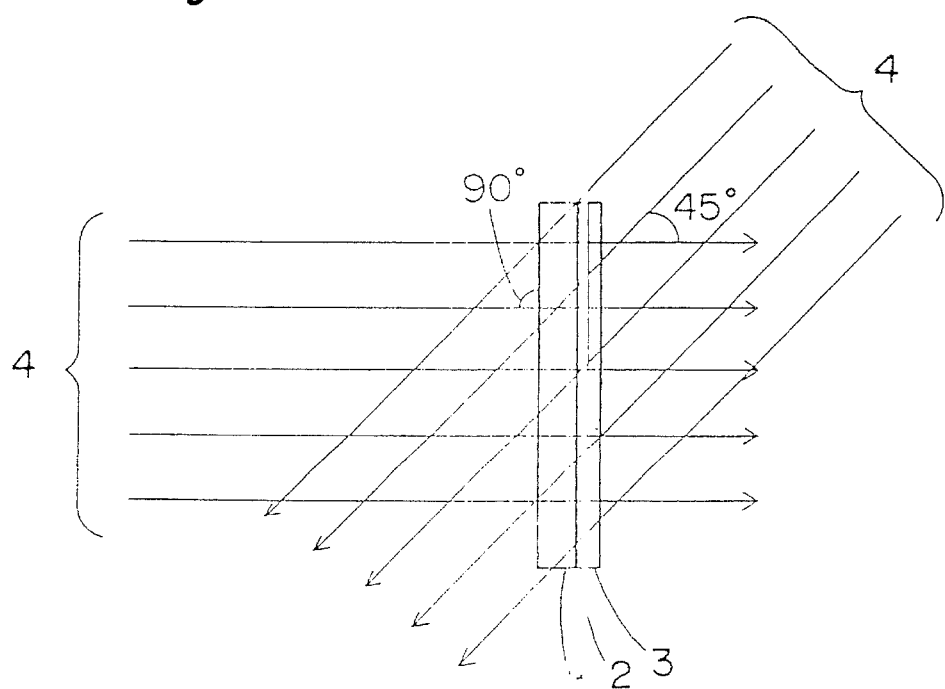
FIG. 1 is a schematic diagram illustrating a reflection type hologram recording in the first exposure.

According to the present invention, there is provided a Photosensitive composition for volume hologram recording which is used for recording an interference fringe produced by a laser beam or a light having excellent coherence, said composition comprising:

(a) a cationic polymerizable compound which is liquid at ambient temperature (b) a radical polymerizable compound;

(c) a radical photopolymerization initiator composition sensitized by a laser beam or a light having excellent coherence which has a specific wavelength to polymerize the ingredient (b); and (d) a cationic photopolymerization initiator composition which shows low photosensitivity to light having a specific wavelength and is sensitized by a light having another wavelength to polymerize the ingredient (c), wherein an average refractive index of the ingredient (a) is smaller than that of the ingredient (b).

The present invention also provides a process for producing a volume hologram which comprises irradiating a laser beam or a light having excellent coherence by which a radical photopolymerization initiator composition (c) is sensitized and then irradiating a light having a wavelength which is different from that of the beam or the light having excellent coherence by which a cationic photopolymerization initiator composition (d) is sensitized, to the photosensitive composition for volume hologram recording applied on a substrate.

DETAILED DESCRIPTION OF THE INVENTION

In the present specification, a cationic photopolymerization initiator composition which shows "low photosensitivity" to a laser beam or a light having excellent coherence means those in which the maximum DSC value caused by polymerization initiated by said cationic photopolymerization when a thermal analysis is conducted under the following conditions is not more than 500 µW per 1 mg of a measuring sample, including 0 µW:

Apparatus: A differential scanning calorimeter DSC220 and a light source equipment UV-1 (both manufactured by Seiko Denshi Kogyo K.K.) are used in a thermal analysis system SSC5200;

Sample: It is prepared by dissolving the objective cationic photopolymerization initiator composition in a cationic polymerizable compound UVR-6110 (manufactured by Union Carbide Co.) in an amount of 3% by weight (an organic solvent may be evaporated after the cationic photopolymerization initiator composition is dissolved in a mixture of the organic solvent and the cationic polymerizable compound); and Irradiation: A 200 mJ/cm² of light containing the same wavelength as a laser beam or a light having excellent coherence is irradiated by UV-1 equipped with an interference filter (band width: 10 nm).

The cationic polymerizable compound (a) used in the present invention is cationically polymerized by Bronsted acid or Lewis acid produced by decomposition of a cationic photopolymerization initiator composition (d) in the composition according to the whole exposure (hereinafter, referred to as postexposure) after a radical polymerized compound (b) was polymerized by irradiation of a laser beam or a light having excellent coherence (hereinafter, referred to as the first exposure). As the cationic polymerizable compound (a), those compounds which are liquid at a normal temperature may be used such that polymerization of the radical polymerizable compound (b) is consistently conducted in a composition having comparative low viscosity. As the cationic polymerizable compound (a), for example, there are compounds as described in Chemtech. Oct., J. V. Crivello, page 624, (1980); Japanese Patent Kokai No. 62-149784; Japan Adhesion Society, Vol. 26, No. 5, pages 179–187 (1990) and the like.

Examples of the cationic polymerizable compound (a) include diglycerol polyglycidyl-ether, pentaerythritol polyglycidyl ether, 1,4-bis(2,3-epoxypropoxyperfluoroisopropyl)cyclohexane, sorbitol polyglycidyl ether, trimethylolpropane polyglycidyl ether, resorcin diglycidyl ether, 1,6-hexanediol diglycidyl ether, polyethylene glycol diglycidyl ether, phenyl glycidyl ether, p-t-butylphenyl diglycidyl ether, diglycidyl adipate, diglycidyl o-phthalate, dibromophenyl glycidyl ether, dibromoneopenthyl, glycol diglycidyl ether, 1,2,7,8-diepoxyoctane, 1,6-dimethylolperfluorohexane glycidyl ether, 4,4'-bis(2,3-epoxypropoxyperfluoroisopropyl)diphenyl ether, 3,4-epoxycyclohexylemethyl-3',4'-epoxycyclohexane carboxylate, 3,4-epoxycyclohexyl oxirane, 1,2,5,6-diepoxy-4,7-methanoperhydroindene, 2-(3,4-epoxycyclohexyl)-3',4'-epoxy-1,3-dioxane-5-spirocyclohexane, 1,2-ethylenedioxybis(3,4-epoxycyclohexylmethane), 4',5'-epoxy-2'-methylcyclohexylmethyl-4.5-epoxy-2-methylcyclohexane carboxylate, ethylene glycol-bis(3,4-epoxycyclohexane carboxylate), bis(3,4-epoxycyclohexylmethyl)adipate, di-2,3-epoxycyclopentyl ether, vinyl-2-chloroethyl ether, vinyl-n-butyl ether, triethylene glycol divinyl ether, 1,4-cyclohexanedimethanol divinyl ether, trimethylolethane trivinyl ether, vinylglycidyl ether, compounds represented by the formulas:

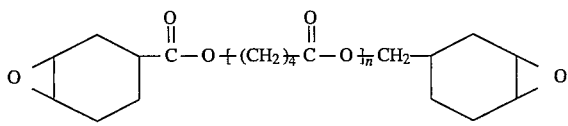

[wherein n is an integer of 1 to 5] and

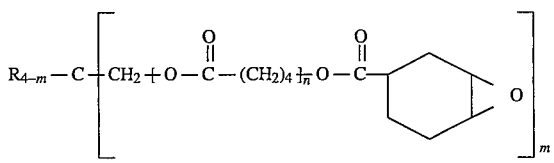

[wherein m is 3 or 4, R is ethyl or a hydroxymethyl group and n is as defined above] and the like, and one or more sorts or them may be used The radical polymerizable compound (b) used in the present invention may be preferably those containing at least one ethylenically unsaturated double bond in a molecule, preferably. Further, an average refractive index of the radical polymerizable compound (b) is larger than that of the above cationic polymerizable compound (a), and wherein the difference is preferably larger than 0.02. When the average refractive index is smaller than that of the compound (a), the refractive index modulation becomes insufficient, and it is not preferred. Examples of the radical polymerizable compound (b) include acrylamide, methacrylamide, styrene, 2-bromostyrene, phenyl acrylate, 2-pheoxyethyl acrylate, (acryloxyethyl)naphthalene dicarboxylate monoester, methylpheoxyethyl acrylate, nonylphenoxyethyl acrylate, β-acryloxyetyl hydrogen phthalate, phenoxy polyethylene glycol acrylate, 2,4,6-tribromophenyl acrylate, (2-methacryloxyethyl)diphenate monoester, benzyl acrylate, 2,3-dibromophenyl acrylate, 2-hydroxy-3-phenoxypropyl acrylate, 2-naphthyl acrylate, N-vinylcarbazole, 2-(9-carbazole)ethyl acrylate, triphenylmethyl triacrylate, 2-(tricyclo[5,2,10$^{2.6}$] dibromodecylthio)ethyl acrylate, S-(1-naphthylmethyl)thioacrylate, dicyclopentanyl acrylate, methylene bisacrylamide, polyethylene glycol diacrylate, trimethylpropane triacrylate, pentaerythritol acrylate, (2-acryloxyethyl) (3-acryloxypropyl-2-hydroxy)diphenate, (2-acryloxyethyl) (3-acryloxypropyl-2-hydroxy)2,3-naphthalenedicarboxlate, (2-acryloxyethyl) (3-acryloxypropyl-2-hydroxy)4,5-phenanthrenedicarboxylate diester, dibromoneopenthyl glycol diacrylate, dipentaerythritol hexaacrylate, 1,3-bis-[2-acryloxy-3-(2,4,6-tribromophenoxy)propoxy]benzene, diethylene dithioglycol diacrylate, 2,2-bis(4-acryloxyethoxyphenyl)propane, bis(4-acryloxydiethoxyphenyl)methane, bis(4-acryloxyethoxy-3,5-dibromophenyl)methane, 2,2-bis(4-acryloxyethoxyphenyl)propane, 2,2-bis(4-acryloxyethoxy-3,5-dibromophenyl)propane, bis(4-acryloxyethoxyphenyl)sulfone, bis(4-acryloxydiethoxyphenyl)sulfone, bis(4-acryloxypropoxyphenyl)sulfone, bis(4-acryloxyethoxy-3,5-dibromophenyl)sulfone, compounds wherein the above-described acrylate is changed to methacrylate, ethylenically unsaturated double bond-containing compounds having at least two S atoms in a molecule as described in Japanese Patent Kokai Nos. 2-247205 and 2-261808 and the like, and one or more sorts them may be used.

The radical photopolymerizatmon initiator composition (c) used in the present invention may be those in which the above radical polymerizable composition (b) is polymerized by an active radical which is formed by the first exposure for the production of a hologram. As the radical photopolymerization initiator composition (c), for example, there can be used known compositions described in U.S. Pat. Nos. 4,766, 055, 4,868,092, 4,965,171, Japanese Patent Kokai Nos. 54-151204 , 58-15503, 58-29803, 59-189340, 60-76735, 1-28715, Japanese Patent Application Nos. 3-5569, Proceedings of Conference on Radiation Curing Asia, pages 461–477, 1988 and the like.

The term "photopolymerization initiator composition" used in the present specification means that a sensitizer which is generally an ingredient absorbing a light can be used in combination with an active radical-generating compound or acid-generating compound. As the sensitizer in the radical photopolymerization initiator composition, a color compound (e.g. organic dyestuff, etc.) is normally used for absorbing a visible laser light. When a colorless and transparent hologram is requested (e.g. using a head up display of car, etc.), it is preferred to use a cyanine dye as described in Japanese Patent Application No. 58-29803, Japanese Patent Kokai No. 1-287105, Japanese Patent Application No. 3-5569 and the like as the sensitizer. The cyanine dye is liable to decompose by a light and, therefore, a dye in the hologram is decomposed by standing it under postexposure in the present invention, or a room light or sunlight or several hours or days, which results in no absorption of a visible light to give a colorless and transparent hologram. Examples of the cyanine dye include anhydro-3,3'-dicarboxymethyl-9-ethyl-2,2'-thiacarbocyanine betaine, anhydro-3-carboxymethyl-3',9 -diethyl-2,2'-thiacarbocyaninebetaine, 3,3',9-triethyl-2,2'-thiacarbocyanine iodide, 3,9-diethyl-3'-carboxymethyl-2,2'-thiacarbocyanine iodide, 3,3', 9-triethyl-2,2'-(4,5,4',5'-dibenzo)thiacarbocyanine iodide, 2-[3-(3-ethyl-2-benzothiazolidene)-1-propenyl]-6-[2-(3 -(3-ethyl-2-benzothiazolidene)ethylideneimino]-3-ethyl-1,3,5-thiadiazolium iodide, 2-[[3-allyl-4-oxo-5-(3-n-propyl-5,6-dimethyl-2 -benzothiazolidene)-ethylidene-thiazolidene] methyl]3-ethyl-4,5-diphenylthiazolinium iodide, 1,1',3,3,3', 3'-hexamethyl-2,2'-indotricarbocyanine iodide, 3,3'-diethyl-2,2'-thiatricarbocyanine perchlorate, anhydro-1-ethyl-4-methoxy-3'-carboxymethyl-5'-chloro-2,2'-quinothiacyanine betaine, anhydro-5,5'-diphenyl-9-ethyl-3,3'-disulfopropyloxacarbocyanine hydroxide triethylamine salt and the like, and one or more sorts of them may be used.

As the active radical-generating compound which may be used in combination with the cyanine, dye, there are diaryl iodonium salts as described in Japanese Patent Kokai Nos. 58-29803, 1-287105, Japanese Patent Application No. 3-5569, 2,4,6-substituted-1,3,5-triazines and the like. When high photosensitivity is requested, it is particularly preferred to use diaryl iodonium salts. Examples of the above diaryl iodonium salts include chloride, bromide, tetrafluoroborate, hexafluorophosphate, hexafluoroarsenate, hexafluoroantimonate and the like (e. g. diphenyliodonium, 4,4'-dichlorodiphenyl iodonium, (4-methoxyphenyl) phenyliodonium, (4-octyloxyphenyl)phenyliodonium, 4,4'-dimethoxydiphenyliodonium, 4,4'-ditertiary butyldiphenyliodonium, 3,3'-dinitrodiphenyliodonium, etc.). Examples of the above-described 2,4,6-substituted-1,3,5-triazines include 2-methyl-4, 6-bis(trichloromethyl)-1,3,5-triazine, 2,4,6-tris(trichloromethyl)-1,3,5-triazine, 2-phenyl-4,6-bis(trichloromethyl)-1,3,5-triazine, 2,4-bis(trichloromethyl)-6-(p-methoxyphenylvinyl)-1,3,5-triazine, 2-(4'-methoxy-1'-naphthyl)-4,6-bis(trichloromethyl)-1,3,5-triazine and the like.

The cationic photopolymerization initiator composition (d) used in the present invention may be those which show low photosensitivity to the first exposure, which are sensitized with a postexposure irradiating a light having a wavelength which is different from that of the first exposure to form Bronsted acid or Lewis acid which polymerizes the above cationic polymerizable compound (a). The present invention is characterized in that a cationic polymerizable compound which is liquid at ambient temperature hardly react during polymerizing a radical polymerizable compound by the irradiation of a laser beam or a light having excellent coherence. Thereby, a refractive index modulation which is larger in comparison with the prior art can be obtained. Accordingly, as the cationic photopolymerization initiator composition, those in which no cationic polymerizable compound is polymerized during the first exposure is particularly preferred. As the cationic photopolymerization initiator composition (d), for example, there are those as described in "UV Curing", Science and Technology, pp. 23–76, edited by S. Peter Pappas; A Technology Marketing Publication; and Commemts Inorg. Chem., B. Kilngert, M. Riediker and A. Roloff, Vol. 7, No. 3, pp. 109–138 (1988), and one or more sorts of them may be used.

As the particularly preferable cationic photopolymerization initiator composition (d), for example, there are diaryliodonium salts, triarylsulfonium salts, iron allene complex and the like.

As the preferred diaryliodonium salts in the cationic photopolymerization initiator composition (d), for example, there are tetrafluoroborate, hexafulorophosphate, hexafluoroarsenate and hexafluoroantimonate of iodonium described as to the above radical photopolymerization initiator composition (c). As the preferred triaryl sulfonium salts, for example, there are tetrafluoroborate, hexafluorophosphate, hexafluoroarsenate and hexafluoroantimonate of sulfonium (e.g. triphenylsulfonium, 4-tertiarybutyltriphenylsulfonium, tris(4-methylphenyl)sulfonium, tris(4-methoxyphenyl)sulfonum, 4 -thiophenyltriphenylsulfonium, etc.).

In the photosensitive composition of the present invention, if necessary, additives, such as polymeric binders, thermopolymerization inhibitors, silane coupling agents, plasticizers, colorants and the like may be used in combination. The polymeric binder may be used for improving the film-forming properties of the composition before formation of the hologram achieving and uniformity of film thickness, or for keeping the interference fringe formed by radical polymerization stable until postexposure. The polymeric binder may be those which have good compatibility with the cationic polymerizable compound or radical polymerizable compound, and examples thereof include chlorinated polyethylene, polymethyl metacrylate, copolymer of methyl methacrylate with the other acrylic alkyl ester, copolymer of vinyl chloride with acrylonitrile, polyvinyl acetate, polyvinyl alcohol, polyvinyl formal, polyvinyl butyral, polyvinyl pyrrolidone, ethyl cellulose, acetyl cellulose and the like. The polymeric binder may contain a reactive group (e.g. cationic polymerizable group, etc.) at the side chain or main chain thereof.

In the photosensitive composition of the present invention, the amount of the cationic polymerizable compound (a) is preferably 2 to 70% by weight (particularly 10 to 50% by weight), the amount of the radical polymerizable compound (b) is preferably 30 to 90% by weight (particularly 40 to 70% by weight), the amount o the radical photopolymerization initiator composition (c) is preferably 0.3 to 8% by weight (particularly 1 to 5% by weight) and the amount of the cationic photopolymerization initiator composition (d) is preferably 0.3 to 8% (particularly 1 to 5%), based on the total weight of the composition.

The photosensitive composition of the present invention may be prepared by a normal method. For example, it can be prepared by formulating the above ingredients (a) to (d) and optional ingredients as they are or formulating them in a solvent (e.g. ketone solvents such as methyl ethyl ketone, acetone, cyclohexanone and the like; ester solvents such as ethyl acetate, butyl acetate, ethylene glycol diacetate and the like; aromatic solvents such as toluene, xylene and the like; cellosolve solvents such as methylcellosolve, ethyl cellosolve, butyl cellosolve and tile like; alcohol solvents such as methanol, ethanol, propanol and the like; ether solvents such as tetrahydrofuran, dioxane and the like; halogen solvents such as dichloromethane, chloroform; etc.) and mixing in a dark place, for example, using a high speed stirrer.

In the production of the hologram of the present invention, a recording layer (2) can be formed by applying the above photosensitive composition on a transparent substrate (e.g. glass sheet (1), polyethylene terephthalate film, polyethylene film, acrylic sheet, etc.) and optionally drying. The amount of coating may be appropriately selected, or example, the dry coating weight may be 1 to 50 g/m². Further, a protective layer (e.g. polyethylene terephthalate film, polyethylene film (3), polypropylene film, etc.) is normally provided on this recording layer (2). In the other method for preparing a three-layer article of which intermediate layer is a recording layer of the composition of the present invention, for example, a recording layer (2) is formed between two polyethylene terephthalate films, one of which is subjected to a treatment which enables easy peeling, and one of the films may be peeled oil upon use to laminate the surface on an appropriate substrate. For example, the composition of the present invention can also be poured between two glass sheets.

The recording layer (2) thus prepared polymerizes with the above radical polymerizable compound (b) by a laser beam (4) or light having excellent coherence (e.g. a light having a wavelength of 300 to 1200 nm), using a holography exposing apparatus, thereby, an interference fringe is recorded in the inside. In the composition of the present invention, a diffracted light due to the recorded interference fringe can be obtained at this stage to form a hologram. However, in order to further polymerize the unreacted cationic polymerizable compound (a), a light as the postexposure, by which the cationic photopolymerization initiator composition (d) is sensitized, is irradiated to the whole hologram to obtain a hologram of the present invention. In this case, the unreacted radical polymerizable compound may be cured, simultaneously. Further, by treating a recording layer with heat or infrared rays before postexposure, diffraction efficiency, peak wavelength or half-value of diffracted light, band width and the like can be changed.

For example, the above volume hologram can be used for lens, diffraction grating, interference filter, head up display apparatus, general three-dimensional display, binder for optical fiber, optical polarized light device for facsimile, memory material such as ID card, windowpane for building, advertisement medium and the like.

According to the photosensitive composition or volume hologram recording, a volume hologram which is superior in diffraction efficiency, wavelength selectivity, refractive index modulation, film strength and the like can be easily produced.

The following Examples, Comparative Examples and Reference Examples further illustrate the present invention in detail but are not to be construed to limit the scope thereof.

By using a photosensitive composition in each Example and Comparative Example described below, a test sheet was made. Then, the test sheet was exposed to obtain each hologram, and determination o physical properties were conducted by the following method.

Preparation of test sheet

A predetermined amount of a radical photopolymerization initiator composition (c) and a cationic photopolymerization initiator composition (d) were dissolved or dispersed in ethanol (1.5 g) and to this were added methyl ethyl ketone (0.7 g) and a predetermined amount of a cationic polymerizable compound (a), a radical polymerizable compound (b) and a polymeric binder. Then, the mixture was stirred and filtered to obtain a photosensitive solution. This photosensitive solution was applied on a glass sheet (16 cm×16 cm) using an applicator, followed by drying at 60° C. for 5 minutes. Further, a polyethylene film (LUPIC LI, manufactured by Tonen Kagaku K.K.) was laminated thereon using a roller laminating and resulting sheet was cut into pieces in size of 3 cm×4 cm to form a test sheet.

Exposure

Figure 2:
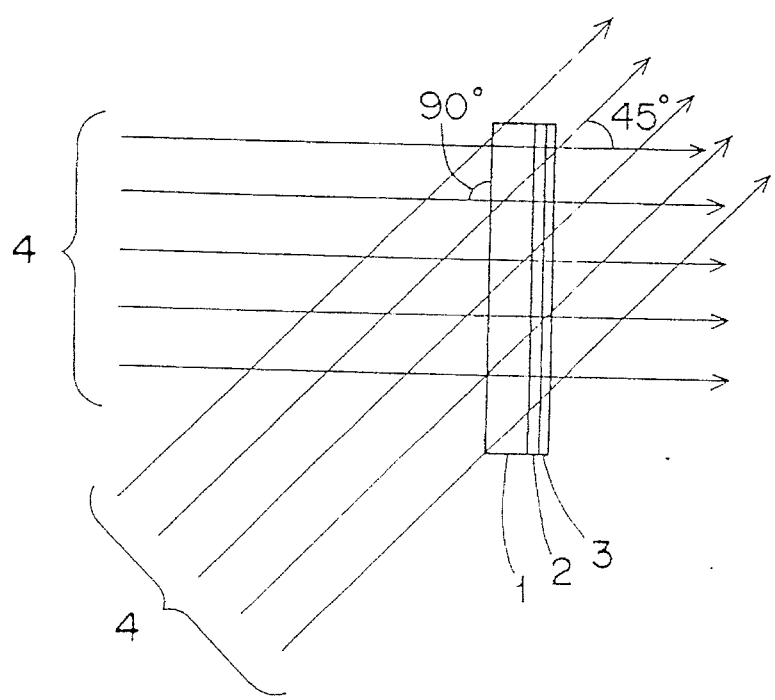
FIG. 2 is a schematic diagram illustrating a transmission type hologram recording in the first exposure.

The first exposure was normally conducted by a light (514.5 nm) using an argon laser. A recording method of a reflection type hologram is shown in FIG. 1 and that of a transmission type hologram is shown in FIG. 2. In both cases, a light intensity of a light beam at the surface of a test sheet is 3 mw/cm² and exposure time is 10 or 30 seconds.

After completion of the first exposure, a light of 15 W low-pressure mercury vapour lamp is irradiated from the polyethylene film side for 5 minutes, as postexposure.

Evaluation

The diffraction efficiency of a reflection type hologram was determined by measuring a reflection rate of a hologram, using a spectrophotometer UV-2100 (manufactured by Shimazu Seisakusho K.K.) equipped with an intergrating sphere reflector ISR-260. The diffraction efficiency of a transmission type hologram was determined by measuring a transmission rate of a hologram, using the above-described spectrophotometer. Further, the film thickness of the part at which diffraction efficiency is determined was determined using a film thickness gauge betascope 850 (manufactured by Fischer Co.). The refractive index modulation (half-value of diffraction index change of interference fringe) was determined by calculating from the diffraction efficiency and film thickness thus obtained. The calculation formula described in "Coupled Wave Theory for Thick Hologram Graings", H. Kogelnik, pages 2909–2947 (1969) was used. The value of the diffraction index modulation does not depend upon the film thickness and diffraction index modulation ability of the composition can be compared using this value.

In order to compare a mechanical strength, a pencil hardness test was conducted as to a part of the hologram.

EXAMPLE 1 to 9

In these Examples, a reflection type hologram was prepared, using various cationic-polymerizable compounds (a). As the radical polymerizable compound (b), AEPM was used. As the radical photopolymerization initiator composition (c), a combination of DYE-1 and DPI.SbF$_6$ was used. The above-described DPI.SbF$_6$ was also used as the cationic photopolymerization initiator composition. The first exposure was conducted at 514.5 nm for 10 seconds in all Examples.

The amount of each ingredient and evaluation results of the hologram are shown in Table 1. In all Examples, a transparent reflection type hologram suitable for practical use was obtained.

TABLE 1

| | Formulation of photosensitive composition, mg | | | | | Evaluation results of reflection type hologram | | | |
|---|---|---|---|---|---|---|---|---|---|
| | Cationic polymerizable compound (a) | AEPM | DYE-1 | DPl. SbF$_6$ | Other ingredient | Film thickness (μm) | Peak wavelength of diffracted light (nm) | Diffraction efficiency (%) | Refractive index modulation |
| Ex. 1 | CAT-1, 900 | 900 | 5 | 60 | P-1, 500 | 16.5 | 520 | 32 | 0.0054 |
| Ex. 2 | CAT 2, 900 | 900 | 5 | 60 | P-1, 500 | 16.1 | 516 | 54 | 0.0081 |
| Ex. 3 | CAT 3, 900 | 900 | 5 | 60 | P-1, 500 | 19.6 | 520 | 37 | 0.0050 |
| Ex. 4 | CAT-4, 900 | 900 | 5 | 60 | P-1, 500 | 15.5 | 517 | 26 | 0.0050 |
| Ex. 5 | CAT 5, 900 | 900 | 5 | 60 | P-1, 500 | 17.4 | 515 | 41 | 0.0060 |
| Ex. 6 | CAT-6, 900 | 900 | 5 | 60 | P-1, 500 | 15.3 | 515 | 46 | 0.0075 |
| Ex. 7 | CAT-7, 900 | 900 | 5 | 60 | P-1, 500 | 15.5 | 524 | 44 | 0.0071 |
| Ex. 8 | CAT-8, 900 | 900 | 5 | 60 | P-1, 500 | 14.7 | 584 | 24 | 0.0050 |
| Ex. 9 | CAT-9, 900 | 900 | 5 | 60 | P-1, 500 | 15.8 | 539 | 33 | 0.0058 |

EXAMPLE 10 to 13

According to the same manner as that described in Examples 1 to 9 except that CAT-1 is used as the cationic polymerizable compound (a) and a kind and combination of the radical polymerizable compound (b) was changed, a reflection type hologram was prepared.

The amount of each ingredient and evaluation results of the hologram was shown in Table 2. In all Examples, a transparent reflection type hologram suitable for practical use was obtained.

Comparative Examples 1 to 5

These are Comparative Examples against the above-described Examples 1 to 13, which show the fact that, when the cationic polymerizable compound (a) and radical polymerizable compound (b) are not used in a proper combination, a reflection type hologram is scarcely obtained, or performances of the resulting hologram is insufficient. The amount of each ingredient and evaluation results of the hologram are shown in Table 3. In the present invention, when the refractive index of the cationic polymerizable compound (a) is larger than that of the radical polymerizable compound (b), as shown in Comparative Examples 3 to 5, the refractive index modulation becomes remarkably inferior. It is considered that the mechanism of the present invention or forming the interference fringe is different from that of E. A. Chandross et al . . .

TABLE 3

| | Formulation of photosensitive composition, mg | | | | | Evaluation results of reflection type hologram | | | |
|---|---|---|---|---|---|---|---|---|---|
| | Cationic polymerizable compound (a) | Radical polymerizable compound (b) | DYE-1 | DPl. SbF$_6$ | Other ingredient | Film thickness (μm) | Peak wavelength of diffracted light (nm) | Diffraction efficiency (%) | Refractive index modulation |
| Com. 1 | — | AEPM, 1800 | 5 | 60 | P-1, 500 | 12.9 | 533 | 1 | 0.0011 |
| Com. 2 | CAT-1, 1800 | — | 5 | 60 | P-1, 500 | 14.5 | — | 0 | 0 |
| Com. 3 | CAT 1, 900 | PETA, 900 | 5 | 60 | P-1, 500 | 15.6 | 510 | ~0 | ~0 |
| Com. 4 | CAT-10, 900 | PETA, 900 | 5 | 60 | P-1, 500 | 13.5 | — | 0 | 0 |
| Com. 5 | CAT-10, 900 | HDDA, 900 | 5 | 60 | P-1, 500 | 14.1 | 520 | 3 | 0.0018 |

TABLE 2

| | Formulation of photosensitive composition, mg | | | | | Evaluation results of reflection type hologram | | | |
|---|---|---|---|---|---|---|---|---|---|
| | CAT-1 | Radical polymerizable compound (b) | DYE-1 | DPl. SbF$_6$ | Other ingredient | Film thickness (μm) | Peak wavelength of diffracted light (nm) | Diffraction efficiency (%) | Refractive index modulation |
| Ex. 10 | 900 | BMPP, 900 | 5 | 60 | P-1, 500 | 4.6 | 515 | 25 | 0.0165 |
| Ex. 11 | 900 | BMPP, 450 AEPM, 450 | 5 | 60 | P-1, 500 | 11.0 | 517 | 36 | 0.0088 |
| Ex. 12 | 900 | BAPP, 450 AEPM, 450 | 5 | 60 | P-1, 500 | 11.4 | 521 | 39 | 0.0089 |
| Ex. 13 | 900 | DMMD, 450 AEPM, 450 | 5 | 60 | P-1, 500 | 12.5 | 532 | 21 | 0.0055 |

EXAMPLES 14 to 18

A reflection hologram was prepared using various radical photopolymerization initiator composition (c) and cationic photopolymerization initiator composition (d), according to the same manner as that described in Example 1 except that the first exposure was conducted using a light (488 nm) of an argon laser and the exposure time of Examples 16 and 18 was 30 seconds. The amount of each ingredient and evaluation results of the hologram are shown in Table 4. Since $DPI.SbF_6$ and $DPI.PF_6$ in Examples 14 and 15 can be used for both active radical-generating compound in the radical photopolymerization initiator composition (c) and cationic photopolymerization initiator composition (d), half of the amount were described in both items of the above compositions, respectively. A hologram of Example 15 was colored to yellow by a sensitizer DYE-3, and a reflection type hologram which is suitable or practical use was obtained in all Examples.

EXAMPLE 23

According to the same manner as that described in Example 1 except that the amount of CAT-1 and AEPM was respectively changed to 100 mg and 1700 mg, a reflection type hologram suitable for practical use was obtained. The evaluation results are as follows.

Film thickness: 17.1 μm

Peak wavelength of diffracted light: 510 nm

Diffraction efficiency: 25%

Refractive index modulation: 0.0045

Pencil hardness: 3H

EXAMPLE 24

According to the same manner as that described in Example 1 except that DYE-4 was used instead of DYE-1 and a light of 632.8 nm (light intensity of a light beam: 0.15 $mW/cm^2$) was irradiated for 60 seconds using a helium neon laser as the first exposure, a reflection type hologram which can diffract a red light was obtained. The determination results are as follows.

Film thickness: 7.4μ

Peak wavelength of diffracted light: 625 nm

Diffraction efficiency: 32%

Refractive index modulation: 0.0063

TABLE 4

| | | | Formulation of photosensitive composition, mg | | | Evaluation results of reflection type hologram | | | |
|---|---|---|---|---|---|---|---|---|---|
| | CAT-1 | AEPM | Radical photopolymerization initiator composition (c) | Cationic photopolymerization initiator composition (d) | Other ingredient | Film thickness (μm) | Peak wavelength of diffracted light (nm) | Diffraction efficiency (%) | Refractive index modulation |
| Ex. 14 | 900 | 900 | DYE-2, 5<br>$DPI.SbF_6$, 30 | $DPI.SbF_6$, 30 | P-1, 500 | 11.2 | 518 | 23 | 0.0065 |
| Ex. 15 | 900 | 900 | DYE-3 5<br>NPG, 30<br>$DPI.SbF_6$, 30 | $DPI.SbF_6$, 30 | P-1, 500 | 13.3 | 490<br>(488 nm exposure) | 36 | 0.0069 |
| Ex. 16 | 900 | 900 | DYE-1, 5<br>BTTB, 30 | $TPS.PF_6$, 30 | P-1, 500 | 16.3 | 514 | 17 | 0.0038 |
| Ex. 17 | 900 | 900 | DYE-1, 5<br>DPl.Cl, 30 | $TPS.PF_6$, 30 | P-1, 500 | 15.9 | 519 | 32 | 0.0056 |
| Ex. 18 | 900 | 900 | DYE-1, 5<br>TCMT, 30 | $TPS.PF_6$, 30 | P-1, 500 | 14.0 | 517 | 15 | 0.0041 |

EXAMPLES 19 to 20

According to the same manner as that described in Examples 1 and 11 except that no polymeric binder P-1 was used, a reflection type hologram was prepared. The evaluation results of the hologram are shown in Table 5. In these Examples, since a viscosity of the solution becomes smaller than that of the solution wherein a polymeric binder is used, it was slightly difficult to control the film thickness, although refractive index modulation which is the same as that obtained when P-1 was used can be obtained in both Examples.

EXAMPLE 21 to 22

In these Examples, a transmission type hologram was prepared, A test sheet which is the same as that used in Examples 1 and 11 was used. The evaluation results of the hologram thus obtained are shown in Table 5. In all Examples, a transmission type hologram suitable for practical use was obtained.

TABLE 5

| | Formulation of photosensitive composition | Type of hologram | Film thickness (μm) | Peak wavelength of diffracted light (nm) | Diffraction efficiency (%) | Refractive index modulation |
|---|---|---|---|---|---|---|
| Ex. 19 | same as that of Ex. 1 except that p-1 is excluded | Reflection | 8.7 | 525 | 8 | 0.0046 |
| Ex. 20 | same as that of Ex. 11 except that p-1 is excluded | Reflection | 7.5 | 518 | 13 | 0.0070 |
| Ex. 21 | same as that of Ex. 1 | Transmission | 12.1 | 555 | 11 | 0.0048 |
| Ex. 22 | same as that of Ex. 1 | Transmission | 11.7 | 555 | 18 | 0.0062 |

The pencil hardness of a hologram obtained in the above Example 1, 11, 19, 22 and 23 was 3H, and that of a hologram obtained in Example 7 was 2H.

Further, when $DPI.SbF_6$ and $TPS.PF_6$ used as the cationic photopolymerization initiator composition in the above Examples were subjected to a thermal analysis test, respectively and, as a result, all maximum DSC value was about 0 μW. This value is that from which a DSC value (heat of absorption) obtained when UVR-6110 was tested alone was deducted to get the value caused by photopolymerization.

Reference Examples 1 to 6

These are results of a test which was conducted in order to compare a hologram of the present invention with that of the prior art. According to the same manner as that described in Example 1 except some changes mentioned in Table 6, a hologram was prepared. The evaluation results of the hologram are shown in Table 6.

CAT-3 (1.485): Celloxide 2083, manufactured by Daiseru Kagaku K.K.

CAT-4 (1.501): Epolead GT-300, manufactured by Daiseru Kagaku K.K.

CAT-5 (1.495): Epolead GT-302, manufactured by Daiseru Kagaku K.K.

CAT-6 (1.492): Sorbitol polyglycidyl ether, Denacol EX-614B, manufactured by Nagase Kasei Kogyo K.K.

CAT-7 (1.487): Pentaerythritol polyglycidyl ether, Denacol EX-411, manufactured by Nagase Kasei Kogyo K.K.

CAT-8 (1.462): Neopentyl glycol diglycidyl ether, Denacol EX-212, manufactured by Nagase Kasei Kogyo K.K.

CAT-9 (1.468): Celloxide 3000, manufactured by Daiseru Kagaku Kogyo K.K.

CAT-10 (1.601): Dibromophenyl glycidyl ether, Denacol EX-147, manufactured by Nagase Kasei Kogyo K.K.

Radical polymerizable compound (b)

AEPM (1.539): Bis(4-acryloxydiethoxyphenyl)methane

TABLE 6

| REF. | Formulation of photosensitive composition (mg) | Remarks | Type of hologram | Film thickness (μm) | Peak wavelength of diffracted light (nm) | Diffraction efficiency (%) | Refractive index modulation | Pencil hardness |
|---|---|---|---|---|---|---|---|---|
| Ex. 1 | PVAC/NVC/POEA/ TEGD/DYE-1/DPl.SbF$_6$ 1230 600 230 230 5 60 | Solvent: MEK 3.7 g | Reflection | 10.5 | — | 0 | 0 | <6B |
| Ex. 2 | PVAC/NVC/POEA/ TMPT/DYE-1/DPl.SbF$_6$ 1400 290 560 50 5 60 | Solvent: MEK 3.7 g | Reflection | 9.1 | 518 470*[1] | 4 11*[1] | 0.0031 0.0053*[1] | 5B F*[1] |
| Ex. 3 | BMA/EGDM/PNA/ DYE-1/DPl.SbF$_6$ 770 770 770 5 60 | *[2] | Reflection | 15.0 | — | 0 | 0 | *[3] |
| Ex. 4 | P-1/AEPM/DES/ DYE-1/DPl.SbF$_6$ 500 900 900 5 60 | — | Reflection | 26.0 | 486 | 26 | 0.0030 | <6B |
| Ex. 5 | CAB/POEA/TEGD/ DYE-1/DPl.SbF$_6$ 1100 830 370 5 60 | Solvent: MEK 5.7 g | Transmission | 10.9 | 480 | 6 | 0.0034 | <6B |
| Ex. 6 | same as that of REF. Ex. 3 | same as that of REF. EX. 3 | Transmission | 13.0 | — | 0 | 0 | *[3] |

Note)
*[1]After completion of postexposure, a hologram was subjected to a heattreatment at 150° C. for 90 minutes.
*[2]No solvent was used. Overall exposure was conducted before laser exposure.
*[3]No cured film was obtained.

In Tables 1 to 6, abbreviations used were as follows. A refractive index was measured using an Abbé's refractometer. A refractive index is given in parentheses.

Cationic polymerizable-compound (a)

CAT-1 (1.498): 3,4-epoxycyclohexylmethyl-3',4'-epoxycyclohexane carboxylate UVR-6110, manufactured by Union Carbide Co.

CAT-2 (1.490): Celloxide 2081, manufactured by Daiseru Kagaku K.K.

BMPP (1.585): 2,2-Bis(3,5-dibromo-4-methacryloxyethoxyphenyl)propane

BAPP (1.590): 2,2-Bis(3,5-dibromo-4-acryloxyethoxyphenyl)propane

PETA (1.484): Pentaerythritol tetraacrylate

HDDA (1.480): 1,6-Hexanediol diacrylate

DMMD (1.546): (2-Methacryloxyethyl)(3-methacryloxypropyl-2-hydroxy)diphenate

NVC: N-vinylcarbazole

POEA: 2-Phenoxyethyl acrylate
TMPT: Trimethylolpropane triacrylate
BMA: n-Butyl methacrylate
EGDM: Ethylene glycol dimethacrylate Radical photopolymerization initiator composition (c), Cationic photopolymerization initiator composition (d)

DYE-1: 3,9-Diethyl-3'-carboxymethyl-2,2'-thiacarbocyanine iodide

DYE-2: Anhydro-1-ethyl-4-methoxy-3'-carboxymethyl-5'-chloro-2,2'-quinothiacyanine betain DYE-3: 3,3'-Carbonylbis(7-diethylaminocumarin)

DYE-4: 2-[3-(3-ethyl-2-benzothiazolidene)-1-propenyl]-6-[2-(3-ethyl-2-benzothiazolidene)ethylideneimino]-3-ethyl-1,3,5-thiadiazolium iodide NPG: N-Phenylglycine BTTB: 3,3',4,4'-Tetra(t-butylperoxycarbonyl)benzophenone TCMT: 2,4,6-Tris(trichloromethyl)-1,3,5-triazine DPI.Cl: Diphenyliodonium chloride DPI.SbF$_6$: Diphenyliodonium hexaluoroantimonate TPS.PF$_6$: Triphenylsulfonium hexaluorophosphate Other ingredients P-1: Copolymer of methyl methacrylate/ethyl acrylate/2-hydroxypropyl methacrylate (copolymerization ratio: 88/2/10), Mw:50,000

PVAC: Polyvinyl acetate (Aldrich. No. 18,948-0)

CAB: Cellulose acetate butyrate (Aldrich. No. 18,096-3)

TEGD: Triethylene glycol dimethyl ether

DES: Diethyl sebacate

PNA: 1-Phenyl naphthalene

What is claimed is:

1. A process for producing a volume hologram which comprises irradiating a laser beam or a light having excellent coherence by which a radical photopolymerization initiator composition (c) is sensitized to record an interference fringe, and then, irradiating the entire hologram with a light having a wavelength which is different from that of the beam of the light having excellent coherence by which a cationic photopolymerization initiator composition (d) is sensitized, to the photosensitive composition for volume hologram recording applied on a transparent substrate, wherein said photosensitive composition comprises:

(a) a cationic polymerizable compound which is liquid at ambient temperature;

(b) a radical polymerizable compound which is different from said cationic polymerizable compound (a);

(c) said radical photopolymerization initiator composition sensitized by a laser beam or a light having excellent coherence which has a specific wavelength to polymerize the ingredient (b); and (d) said cationic photopolymerization initiator composition which shows low photosensitivity to light having a specific wavelength and is sensitized by light having a wavelength other than said specific wavelength to polymerize the ingredient (a), wherein an average refractive index of the ingredient (a) is smaller than that of the ingredient (b).

2. The process according to claim 1, wherein the radical photopolymerization initiator composition contains a photosensitizer and an active radical-generating compound.

3. The process according to claim 2, wherein the sensitizer is cyanine dye.

4. The process according to claim 3, wherein the active radical-generating compound is a diaryliodonium salt.

5. The process according to claim 1, which further comprises a polymeric binder.

* * * * *